United States Patent
Choi et al.

(10) Patent No.: US 6,913,967 B2
(45) Date of Patent: Jul. 5, 2005

(54) FERROELECTRIC MEMORY DEVICE WITH MERGED-TOP PLATE STRUCTURE AND METHOD FOR FABRICATING THE SAME

(75) Inventors: Eun-Seok Choi, Ichon-shi (KR); Seung-Jin Yeom, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 39 days.

(21) Appl. No.: 10/623,098

(22) Filed: Jul. 18, 2003

(65) Prior Publication Data

US 2004/0124454 A1 Jul. 1, 2004

(30) Foreign Application Priority Data

Dec. 30, 2002 (KR) .................................. 10-2002-0086264

(51) Int. Cl.[7] ........................................ H01L 21/8242
(52) U.S. Cl. ........................................ 438/240; 438/3
(58) Field of Search ............................ 438/3, 240, 253

(56) References Cited

U.S. PATENT DOCUMENTS 5,679,969 A * 10/1997 Evans et al. ................. 257/295
6,638,775 B1 * 10/2003 Kweon ........................... 438/3
6,812,089 B2 * 11/2004 Choi et al. ................... 438/240

* cited by examiner

Primary Examiner—David Nelms
Assistant Examiner—Quoc Hoang
(74) Attorney, Agent, or Firm—Blakely Sokoloff Taylor & Zafman

(57) ABSTRACT

The inventive ferroelectric memory device includes: a semiconductor substrate providing elements of a transistor; a first inter-layer insulating layer formed on the semiconductor substrate; a storage node contact connected to elements of the transistor by passing through the first inter-layer insulating layer; a barrier layer contacting simultaneously to the storage node contact and the first inter-layer insulating layer; a lower electrode having a space for isolating the first inter-layer insulating layer and being formed on the barrier layer; a glue layer being formed on the first inter-layer insulating layer and encompassing lateral sides of the lower electrode as filling the space; a second inter-layer insulating layer exposing a surface of the lower electrode and encompassing the glue layer; a ferroelectric layer formed on the glue layer including the second inter-layer insulating layer; and an upper electrode formed on the ferroelectric layer.

11 Claims, 8 Drawing Sheets

FERROELECTRIC MEMORY DEVICE WITH MERGED-TOP PLATE STRUCTURE AND METHOD FOR FABRICATING THE SAME

FIELD OF THE INVENTION

The present invention relates to a semiconductor device; and, more particularly, to a ferroelectric memory device with a merged-top-plate (MTP) structure and a method for fabricating the same.

DESCRIPTION OF RELATED ARTS

A ferroelectric random access memory device (FeRAM) device with a merged-top-plate (MTP) structure requires a glue layer between an electrode made of a noble metal and a storage node contact (SNC) plug and generally uses a metal oxide layer for the glue layer such as alumina.

Therefore, a glue layer open mask and an etching processes are required to connect the SNC plug and a lower electrode of a storage capacitor. Especially, a wet type etching is employed in the etching process in order to prevent degradation of barrier characteristics of the lower electrode due to an excessive etching of an inter-layer insulating layer.

FIG. 1 is a cross-sectional view illustrating a conventional FeRAM device with a MTP structure.

As shown, a first inter-layer insulating layer 12A is formed on a semiconductor substrate 11 providing a transistor and a bit line (not shown). Then, a SNC plug including a tungsten plug 13 and a barrier metal 14 is connected to the semiconductor substrate 11 by passing through the first inter-layer insulating layer 12A.

A stack lower electrode 15 connected to the SNC plug 13 and 14 is formed on the first inter-layer insulating layer 12A, and a glue layer 16 is formed on the first inter-layer insulating layer 12A beneath a predetermined portion of the stack lower electrode 15. Also, the stack lower electrode 15 is surrounded with a second inter-layer insulating layer 12B. Herein, the glue layer 16 opens an upper portion of the SNC plug in order for the stack lower electrode 15 to be electrically connected to the SNC plug through the barrier metal 14, and the second inter-layer insulating layer 12B has a planar level practically identical to a surface of the stack lower electrode 15.

Also, a ferroelectric layer 17 is formed over an upper surface of the second inter-layer insulating layer 12B and that of the stack lower electrode 15. Afterwards, an upper electrode 18 is formed on the ferroelectric layer 17 facing in opposite direction to the stack lower electrode 15 so as to form one capacitor. A third inter-layer insulating layer 12C covers an upper portion of the ferroelectric layer 17 and a predetermined portion of the upper electrode 18. A metal wire 19 and the upper electrode 18 are connected to each other through a contact hole formed after etching the third inter-layer insulating layer 12C.

However, a mask and an etching processes are also required to complete the formation of the FeRAM device with the MTP structure. There exists a limitation in high degrees of integration since decreases in cell size are also limited due to an alignment margin of the glue layer open mask process and lateral etch accompanied in the wet type etching process. Furthermore, a barrier layer of the stack lower electrode 15 used as the bottom most layer of the stack lower electrode 15 has a layer directly connected to the first inter-layer insulating layer 12A, resulting in a weak adhesiveness. Typically, the barrier layer of the stack lower electrode 15 typically uses Iridium (Ir). Because of the weak adhesiveness, there occurs an interface diffusion between the barrier layer and the first inter-layer insulating layer 12A, further resulting in an unwanted oxidation of the barrier metal 14.

SUMMARY OF THE INVENTION

It is, therefore, an object of the present invention to provide a ferroelectric memory device capable of simplifying complex processes resulted from additions of a glue layer deposition process and a mask and an etching processes and a method for fabricating the same.

It is another object of the present invention to provide a ferroelectric memory device capable of increasing adhesiveness between a lower electrode and an inter-layer insulating layer and a method for fabricating the same.

It is further object of the present invention to provide a ferroelectric memory device capable of preventing oxidation of a barrier metal constructing a storage node contact plug and a method for fabricating the same.

In accordance with an aspect of the present invention, there is provided a ferroelectric memory device, including: a semiconductor substrate providing elements of a transistor; a first inter-layer insulating layer formed on the semiconductor substrate; a storage node contact connected to elements of the transistor by passing through the first inter-layer insulating layer; a barrier layer contacting simultaneously to the storage node contact and the first inter-layer insulating layer; a lower electrode having a space for isolating the first inter-layer insulating layer and being formed on the barrier layer; a glue layer being formed on the first inter-layer insulating layer and encompassing lateral sides of the lower electrode as filling the space; a second inter-layer insulating layer exposing a surface of the lower electrode and encompassing the glue layer; a ferroelectric layer formed on the glue layer including the second inter-layer insulating layer; and an upper electrode formed on the ferroelectric layer.

In accordance with another aspect of the present invention, there is also provided a method for fabricating a ferroelectric memory device, including the steps of: forming a storage node contact making a contact to a semiconductor substrate by passing through the first inter-layer insulating layer formed on the semiconductor substrate; forming a stack pattern of a barrier layer connected to the storage node contact and a lower electrode; forming a space between the lower electrode and the first inter-layer insulating layer by removing selectively lateral sides of the barrier layer; forming simultaneously a glue layer encompassing the lateral sides of the lower electrode as filling the space; forming a second inter-layer insulating layer exposing a surface of the lower electrode as laterally encompassing the glue layer; forming a ferroelectric layer on the second inter-layer insulating layer including the lower electrode; and forming an upper electrode on the ferroelectric layer.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Figure 1:
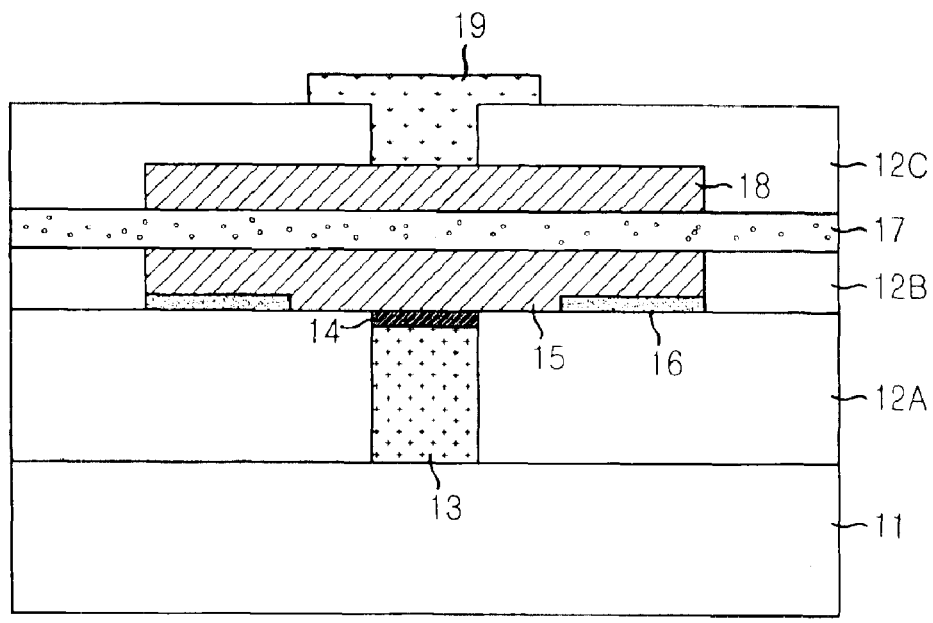
FIG. 1 is a cross-sectional view illustrating a conventional ferroelectric random access memory (FeRAM) device with a merged-top-plate (MTP) structure.
Figure 2:
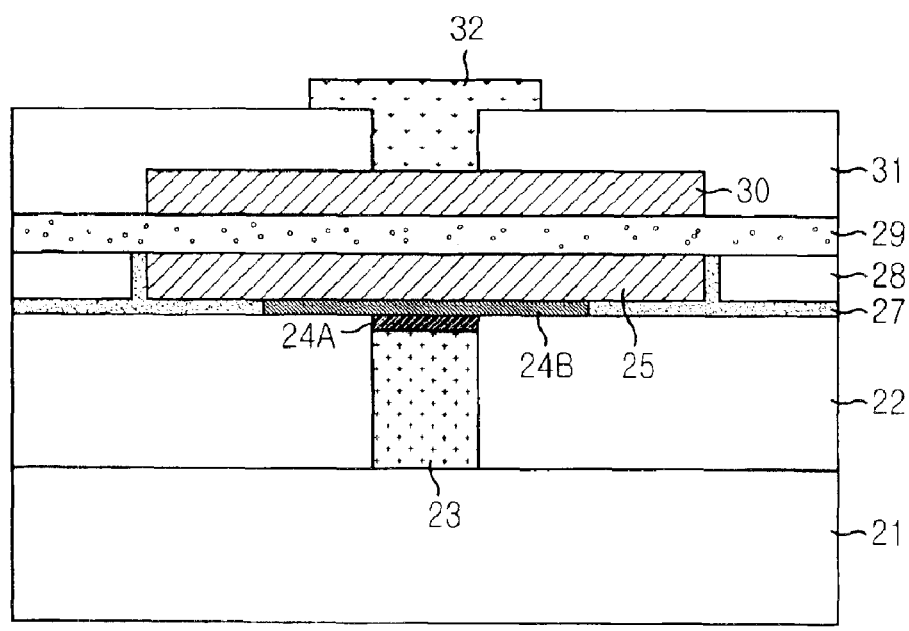
FIG. 2 is a cross-sectional view showing a FeRAM device in accordance with a first preferred embodiment of the present invention.

FIG. 2 is a cross-sectional view showing a ferroelectric random access memory (FeRAM) device in accordance with a first preferred embodiment of the present invention.

As shown, the FeRAM device in accordance with the first preferred embodiment of the present invention includes: a semiconductor substrate 21 providing elements of a transistor; a first inter-layer insulating layer 22 formed on the semiconductor substrate 21; a tungsten plug 23 connected to a source/drain region of the transistor of the semiconductor substrate 21 by passing through the first inter-layer insulating layer 22; a first barrier metal 24A and a second barrier metal 24B being formed on the tungsten plug 23 and contacting simultaneously to the tungsten plug 23 and the first inter-layer insulating layer 22; a lower electrode 25 having a space that isolates the first inter-layer insulating layer 22 from the lower electrode 25 and being formed on the first barrier metal 24A and the second barrier metal 24B; a glue layer 27 being formed on the first inter-layer insulating layer 22 and encompassing lateral sides of the lower electrode 25 as filled in the space between the lower electrode 25 and the first inter-layer insulating layer 22; a second inter-layer insulating layer 28 exposing a surface of the lower electrode 25 and encompassing the glue layer 27; a ferroelectric layer 29 formed on the lower electrode 25, the glue layer 27 and the second inter-layer insulating layer 28; and an upper electrode 30 formed on the ferroelectric layer 29. Also, a third inter-layer insulating layer 31 covers an exposed upper part of the ferroelectric layer 29 and the upper electrode 30, and a metal wire 32 connected to the upper electrode 30 through a contact hole is formed by etching the third inter-layer insulating layer 31.

In more detail, a height of the tungsten plug 23 is different from that of a surface of the first inter-layer insulating layer 22. The barrier metal includes the first barrier metal 24A and the second barrier metal 24B. The first barrier metal 24A is filled into a portion formed by the above height difference, thereby having practically the same planar level to the surface of the first inter-layer insulating layer 22. The second barrier metal 24B contacts to the first inter-layer insulating layer 22 by being formed over the first barrier metal 24A and a predetermined surface area of the first inter-layer insulation layer 22.

Each portion of the glue layer 27 formed on each corresponding element of the above structure has the same thickness. That is, the thickness of the glue layer 27 filling the space between the first inter-layer insulating layer 22 and the lower electrode 25; that of the glue layer 27 encompassing the lower electrode 25; and that of the glue layer 27 formed on the first inter-layer insulating layer 22 are identical to each other.

Also, the lower electrode 25, the glue layer 27 and the second inter-layer insulating layer 28 are practically planarized to the same surface level of the lower electrode 25, and the ferroelectric layer 29 is formed on such structure.

In FIG. 2, the first and the second barrier metals 24A and 24B use any one selected from a group consisting of TiN, TiAlN, TaN, TaAlN, TiSiN, TaSiN, RuTiN, RuTaN, CrTiN, CrTaN, IrTiN and IrTaN or a stacked metal containing at least two of the above.

The glue layer 27 uses any one material or more than one material selected from a group consisting of $Al_2O_3$, $ZrO_2$, $HfO_2$, $Bi_2O_3$, $Ta_2O_5$, $TiO_2$ and silicon nitride.

The lower electrode 25 uses any one selected from a group of a Pt layer, an Ir layer, an $IrO_2$ layer, a Ru layer, a $RuO_2$ layer, a Re layer and a Rh layer or a combined layer of the above layers. For instance, the combined layer can be a stacked layer of Pt/$IrO_2$/Ir layers wherein the bottom most layer, i.e., the Ir layer, is used as a barrier layer for the lower electrode 25.

In addition, the ferroelectric layer 29 is formed by using any one selected from a group consisting of conventional strontium bismuth tantalate (SBT), Lead zirconate titanate (PZT) and Bismuth Lanthanum Titanate (BLT) or any one selected from a group consisting of impurity-added or composition ratio-changed SBT, PZT, SBTN and BLT.

Furthermore, the upper electrode 30 can be made of the same material used for the lower electrode 25.

Meanwhile, it is possible to form a polysilicon plug instead of the tungsten plug 23.

FIGS. 3A to 3E are cross-sectional views showing a method for fabricating the FeRAM device in accordance with the first preferred embodiment of the present invention.

Figure 3A:
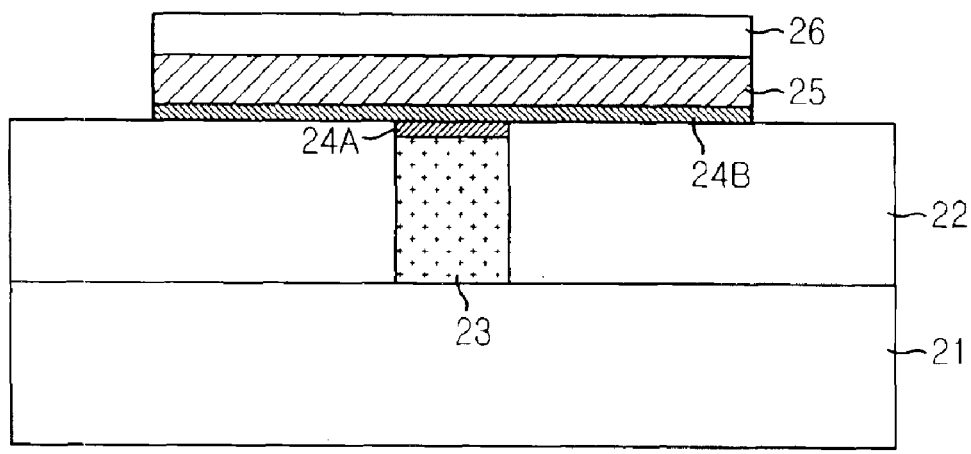
FIGS. 3A to 3E are cross-sectional views showing a method for fabricating the FeRAM device in accordance with the first preferred embodiment of the present invention.

Referring to FIG. 3A, the first inter-layer insulating layer 22 is deposited on the semiconductor substrate 21 providing elements of a transistor and a bit line (not shown), and then, a storage node contact hole (not shown) exposing a partial portion of the semiconductor substrate 21 is formed by etching the first inter-layer insulating layer 22.

Next, a tungsten layer is deposited on the first inter-layer insulating layer 22 including the storage node contact hole, and a recess etch-back process is performed to the tungsten layer so as to form the tungsten plug 23 which is filled with a partial portion of the storage node contact hole.

Then, the first barrier metal 24A is deposited on the first inter-layer insulating layer 22 and the tungsten plug 23, and a chemical mechanical polishing (CMP) process is employed to make the first barrier metal 24A remained inside of the rest portion of the storage node contact hole. That is, the first barrier metal 24A formed on the first inter-layer insulating layer 22 is removed and planarized to the same surface level of the surface of the first inter-layer insulation layer 22.

Afterwards, the second barrier metal 24B is deposited over the first inter-layer insulating layer 22 and the first barrier metal 24A, and a conductive layer for forming the lower electrode 25 is formed on the second barrier metal 24B thereafter.

Herein, the first barrier metal 24A and the second barrier metal 24B can be made of any one selected from a group consisting of TiN, TiAlN, TaN, TaAlN, TiSiN, TaSiN, RuTiN, RuTaN, CrTiN, CrTaN, IrTiN and IrTaN or one stacked with at least two of the above. The conductive layer for the lower electrode 25 is deposited by employing any one among a chemical vapor deposition (CVD) process, a physical vapor deposition (PVD) process, an atomic layer deposition (ALD) process and a plasma enhanced atomic layer deposition (PEALD) process. Particularly, such conductive layer uses any one selected from a group consisting of a Pt layer, an Ir layer, an $IrO_2$ layer, a Ru layer, a $RuO_2$ layer, a Re layer and a Rh layer or a complex constitution of the above. At this time, the complex constitution can be a stacked layer of Pt/IrO$_2$, Ir layers, wherein the bottom most layer, i.e., the Ir layer, is used as a barrier layer for the lower electrode 25.

Subsequently, a lower electrode mask 26 is formed on the above conductive layer. The conductive layer and the second barrier metal 24B are sequentially etched by using the lower electrode mask 26 as an etch mask. Through this etching process, the lower electrode 25 is formed, and the first barrier metal 24A and the second barrier metal 24B are remained in between the lower electrode 25 and the tungsten plug 23. Also, the second barrier metal 24B is allocated in between the lower electrode 25 and the first inter-layer insulating layer 22.

Figure 3B:
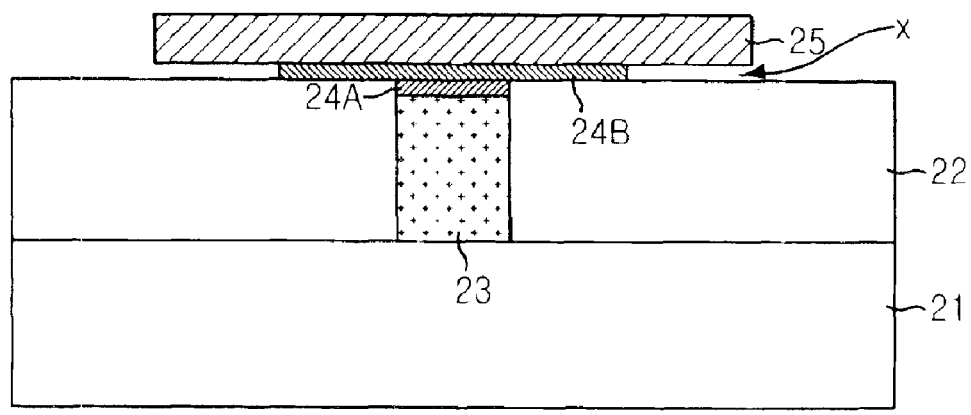

Referring to FIG. 3B, the lower electrode mask 26 is removed, and a wet type etching process is applied to the second barrier metal 24B through the use of a solution that etches selectively the second barrier metal 24B. At this time, the wet type etching to the second barrier metal 24B is set to perform a lateral etch in an inward direction from the end portion of the lower electrode 25. A concentration of the solution and etch time are regulated to control a lateral etch distance. For example, the solution capable of dissolving selectively the second barrier metal 24B through the wet type etching can be at least more than one selected from a group consisting of H$_2$SO$_4$, HNO$_3$ and H$_3$PO$_4$ or a solution obtained by adding H$_2$O$_2$ or NH$_4$OH to the above selected one. Also, when selectively dissolving the second barrier metal 24B, a concentration of the etch solution for controlling an etch width in horizontal direction is controlled.

After performing the wet type etching process to the second barrier metal 24B as described above, a space 'X' is formed between the lower electrode 25 and the first inter-layer insulating layer 22.

Meanwhile, a width of the space 'X' can be formed by controlling a surface thickness of the second barrier metal 24B through an etch-back process or a chemical mechanical polishing process after depositing the second barrier metal 24B.

Figure 3C:
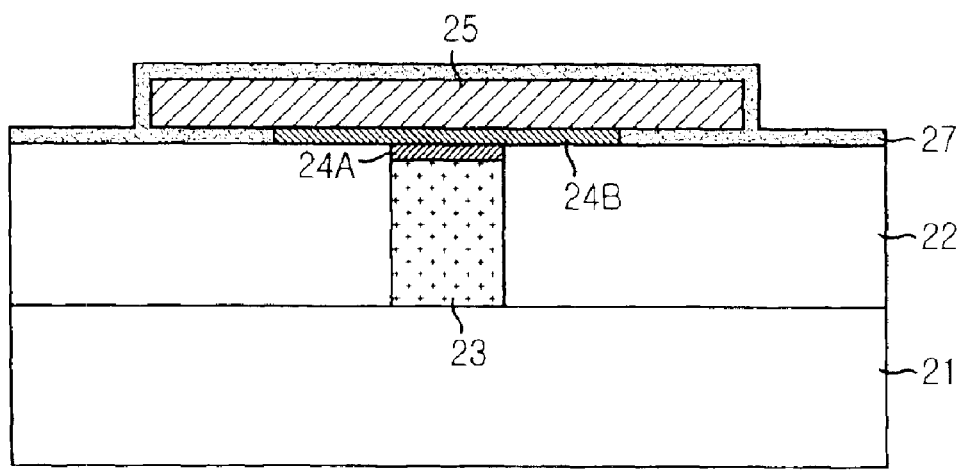

With reference to FIG. 3C, the glue layer 27 is deposited on the above entire structure including the lower electrode 25.

At this time, the glue layer 27 is deposited through the use of a deposition technique with a good step coverage providing a sufficient filling of the space 'X'. For instance, such atomic layer deposition (ALD) technique, chemical vapor deposition (CVD) technique and plasma enhanced atomic layer deposition (PEALD) technique can be used for the glue layer 27 deposition. The glue layer 27 also uses any one material or more than one material selected from a group consisting of Al$_2$O$_3$, ZrO$_2$, HfO$_2$, Bi$_2$O$_3$, Ta$_2$O$_5$, TiO$_2$ and silicon nitride.

If the glue layer 27 is deposited as explained above, the lower electrode 25 is not directly contacted to the first inter-layer insulating layer 22, and thus, there arises a problem of the height difference due to an opened portion by the glue layer 27.

Figure 3D:
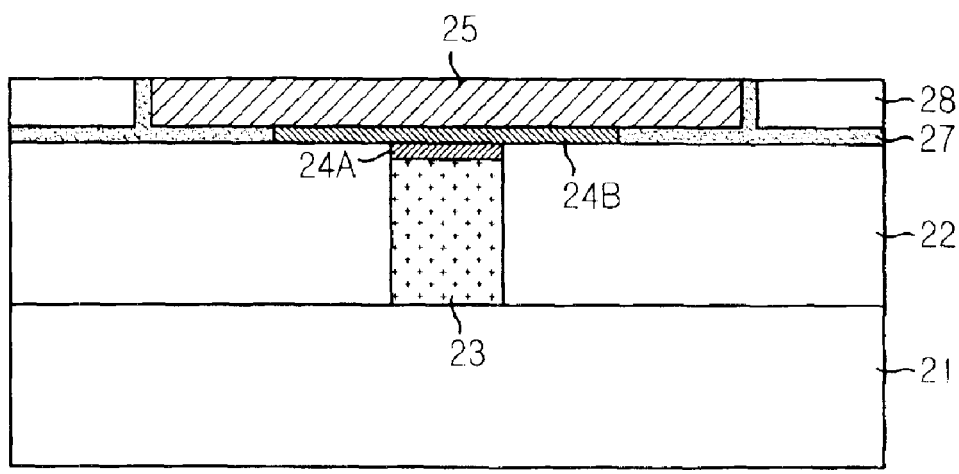

Referring to FIG. 3D, the second inter-layer insulating layer 28 is deposited on the above entire structure including the glue layer 27, and a CMP process or an etch-back process is used until exposing a surface of the lower electrode 25 so to achieve a planarization. That is, the second inter-layer insulating layer 28 and the glue layer 27 are subjected to the CMP process all at once, or the second inter-layer insulating layer 28 is first proceeded with the CMP process, followed by an etch-back process performed to exposed the glue layer 27 from the previous CMP process until exposing the surface of the lower electrode 25.

As described in the above, the glue layer 27 on the lower electrode 25 is removed after the CMP process or the etch-back process, resulting in an exposure of the surface of the lower electrode 25. The glue layer 27 and the second inter-layer insulating layer 28 encompass the lower electrode 25 after the planarization so that the lower electrode 25 formed on each neighboring cell is isolated from each other. Also, the glue layer 27 functions as an adhesion layer between the lower electrode 25 and the second inter-layer insulating layer 28.

Figure 3E:
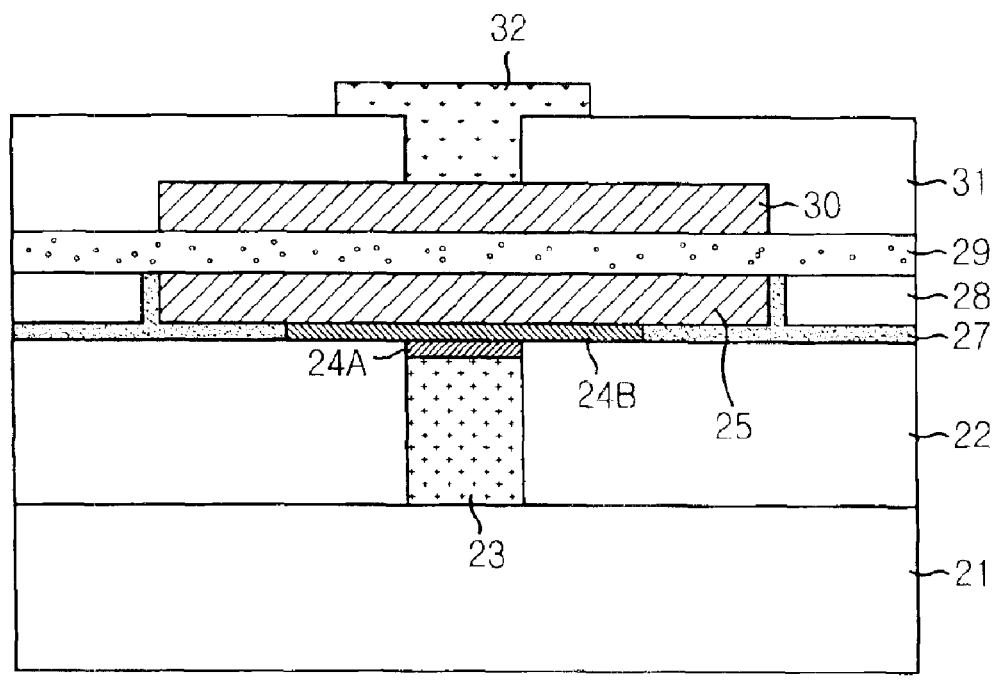

With reference to FIG. 3E, the ferroelectric layer 29 is formed on the above entire structure including the lower electrode 25 of which surface is exposed and patterned so as to be remained only on an entire cell region. Then, a conductive layer for forming the upper electrode 30 is deposited on the ferroelectric layer 29. Herein, the ferroelectric layer 29 is deposited through any one technique selected among a CVD technique, an ALD technique, a metal organic deposition (MOD) technique and a spin coating technique, and uses any one selected from a group consisting of typically used SBT, PZT and BLT or from a group consisting of impurity-added or composition ratio-changed SBT, PZT, strontium bismuth tantalum niobate (SBTN) and BLT.

After forming the ferroelectric layer 29, a thermal process for crystallizing the ferroelectric layer 29 with use of the known prior art is proceeded. The ferroelectric layer 29 is formed on the above-described structure including the buried lower electrode 25 and planarized before forming the upper electrode 30 so to achieve easily the planarized structure along with subsequent processes.

The conductive layer for the upper electrode 30 can use a material used for the lower electrode 25.

Next, the above conductive layer are patterned to form the upper electrode 30, and the third inter-layer insulating layer 31 is deposited on the above entire structure including the upper electrode 30 and planarized thereafter. Then, the third inter-layer insulating layer 31 is etched to form a contact hole exposing a partial portion of the upper electrode 30, and a metal line 32 connected to the upper electrode through the contact hole is subsequently formed, whereby the formation of the FeRAM device with the MIP structure is completed.

Figure 4:
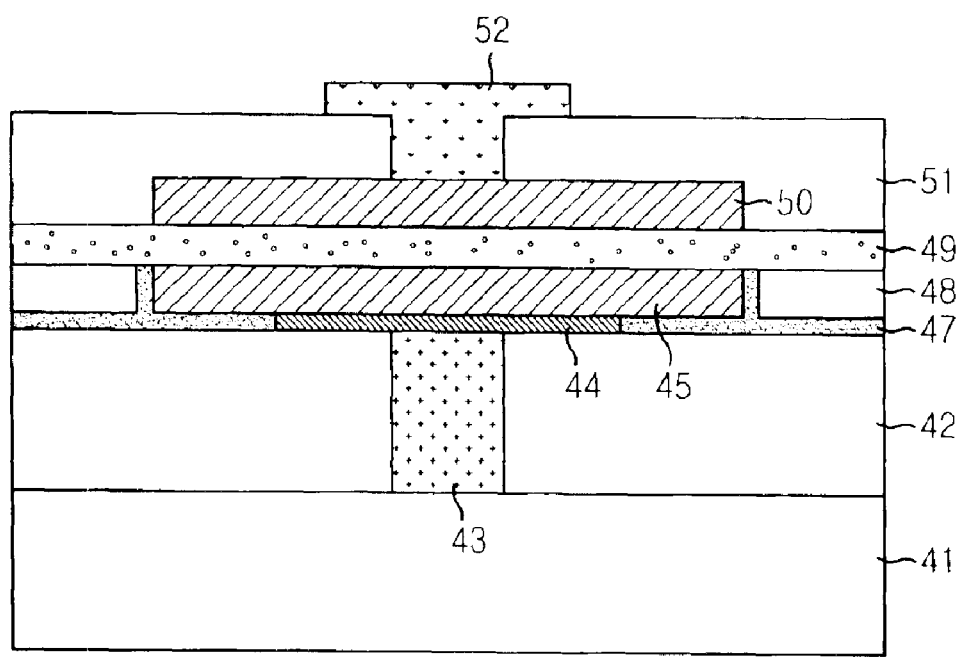
FIG. 4 is a cross-sectional view showing a FeRAM device in accordance with a second preferred embodiment of the present invention.

FIG. 4 is a cross-sectional view showing a FeRAM device in accordance with a second preferred embodiment of the present invention.

Referring to FIG. 4, the FeRAM device includes: a semiconductor substrate 41 providing elements of a transistor; a first inter-layer insulating layer 42 formed on the semiconductor substrate 41; a tungsten plug 43 connected to a source/drain region of the transistor of the semiconductor substrate 41 by passing through the first inter-layer insulating layer 42; a barrier metal 44 being formed on the tungsten plug 43 and contacting simultaneously to the tungsten plug 43 and the first inter-layer insulating layer 42; a lower electrode 45 having a space that isolates the first inter-layer insulating layer 42 from the lower electrode 45 and being formed on the barrier metal 44; a glue layer 47 being formed on the first inter-layer insulating layer 42 and encompassing lateral sides of the lower electrode 45 as filled the space between the lower electrode 45 and the first inter-layer insulating layer 42; a second inter-layer insulating layer 48 exposing a surface of the lower electrode 45 and encompassing the glue layer 47; a ferroelectric layer 49 formed on the lower electrode 45, the glue layer 47 and the second inter-layer insulating layer 48; and an upper electrode 50 formed on the ferroelectric layer 49.

Also, a third inter-layer insulating layer 51 covers an exposed upper part of the ferroelectric layer 49 and the upper electrode 50, and a metal wire 52 connected to the upper electrode 50 through a contact hole is formed by etching the third inter-layer insulating layer 51.

In more detail, the tungsten plug 43 has practically the same surface level to that of the first inter-layer insulating layer 42, and the barrier metal 44 is formed in a single layer on the tungsten plug 43.

Each portion of the glue layer 47 formed on each corresponding element of the above structure has the same thickness. That is, the thickness of the glue layer 47 filling the space between the first inter-layer insulating layer 42 and the lower electrode 45; that of the glue layer 47 encompassing the lower electrode 45; and that of the glue layer 47 formed on the first inter-layer insulating layer 42 are identical to each other.

Also, the lower electrode 45, the glue layer 47 and the second inter-layer insulating layer 48 are practically planarized to the same surface level of the lower electrode 45, and the ferroelectric layer 49 is formed on such structure.

In FIG. 4, the barrier metal 44 uses any one selected from a group consisting of TiN, TiAlN, TaN, TaAlN, TiSiN, TaSiN, RuTiN, RuTaN, CrTiN, CrTaN, IrTiN and IrTaN or a stacked metal containing at least two of the above.

The glue layer 47 is formed by using any one material or more than one material selected from a group consisting of $Al_2O_3$, $ZrO_2$, $HfO_2$, $Bi_2O_3$, $Ta_2O_5$, $TiO_2$ and silicon nitride.

The lower electrode 45 is made of any one selected from a group of a Pt layer, an Ir layer, an $IrO_2$ layer, a Ru layer, a $RuO_2$ layer, a Re layer and a Rh layer or a combined layer of the above layers. For instance, the combined layer can be a stacked layer of Pt/$IrO_2$/Ir layers wherein the bottom most layer, i.e., the Ir layer, is used as a barrier layer for the lower electrode 45.

In addition, the ferroelectric layer 49 uses any one selected from a group consisting of typically used SBT, PZT and BLT or any one selected from a group consisting of impurity-added or composition ratio-changed SBT, PZT, SBTN and BLT.

Furthermore, the upper electrode 50 can be formed by using the same material used for the lower electrode 45.

Meanwhile, it is possible to form a polysilicon plug instead of the tungsten plug 43.

FIGS. 5A to 5E are cross-sectional views showing a method for fabricating the FeRAM device in accordance with the second preferred embodiment of the present invention.

Figure 5A:
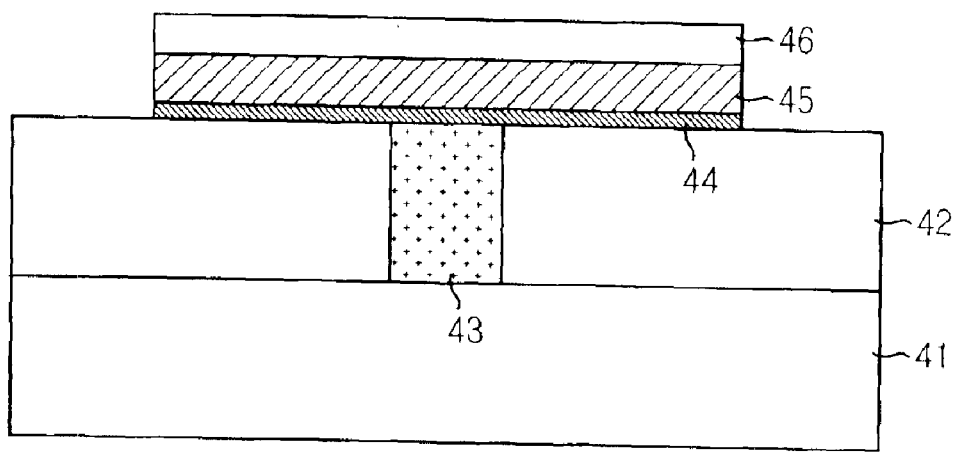
FIGS. 5A to 5E are cross-sectional views showing the FeRAM device in accordance with the second preferred embodiment of the present invention.

Referring to FIG. 5A, the first inter-layer insulating layer 42 is deposited on the semiconductor substrate 41 providing a transistor and a bit line (not shown), and then, a storage node contact hole (not shown) exposing a partial portion of the semiconductor substrate 41 is formed by etching the first inter-layer insulating layer 42.

Next, a tungsten layer is deposited on the first inter-layer insulating layer 42 including the storage node contact hole, and a CMP process or an etch-back process is performed to make a recess of the tungsten layer so as to form a tungsten plug 43 completely buried into the storage node contact hole. At this time, unlike to the first preferred embodiment of the present invention, the CMP process is employed to make the tungsten plug 43 completely buried into the storage node contact hole. In case of employing the etch-back process, it is possible to eliminate a height difference between the tungsten plug 43 and the first inter-layer insulating layer 42 by controlling an etching time. That is, they have practically the same surface level.

Then, the barrier metal 44 is deposited on the above first inter-layer insulating layer 42 and the tungsten plug 43, and a conductive layer for the lower electrode 45 is formed on the barrier metal 44.

Herein, the barrier metal 44 uses any one selected from a group consisting of TiN, TiAlN, TaN, TaAlN, TiSiN, TaSiN, RuTiN, RuTaN, CrTiN, CrTaN, IrTiN and IrTaN or a stacked metal containing at least two of the above. The conductive layer for the lower electrode 45 is deposited by employing any one among a CVD process, a PVD process, an ALD process and a PEALD process. Particularly, such conductive layer uses any one selected from a group consisting of a Pt layer, an Ir layer, an $IrO_2$ layer, a Ru layer, a $RuO_2$ layer, a Re layer and a Rh layer or a combined layer of the above layers. At this time, the combined layer can be a stacked layer of Pt/$IrO_2$, Ir layers, wherein the bottom most layer, i.e., the Ir layer, is used as a barrier layer for the lower electrode 45.

Subsequently, a lower electrode mask 46 is formed on the conductive layer. The conductive layer and the barrier metal 44 are sequentially etched by using the lower electrode mask 46 as an etch mask. Through this etching process, the lower electrode 45 is formed, and the barrier metal 44 is remained in between the lower electrode 45 and the tungsten plug 43 and also allocated in between the lower electrode 45 and the first inter-layer insulating layer 42.

Figure 5B:
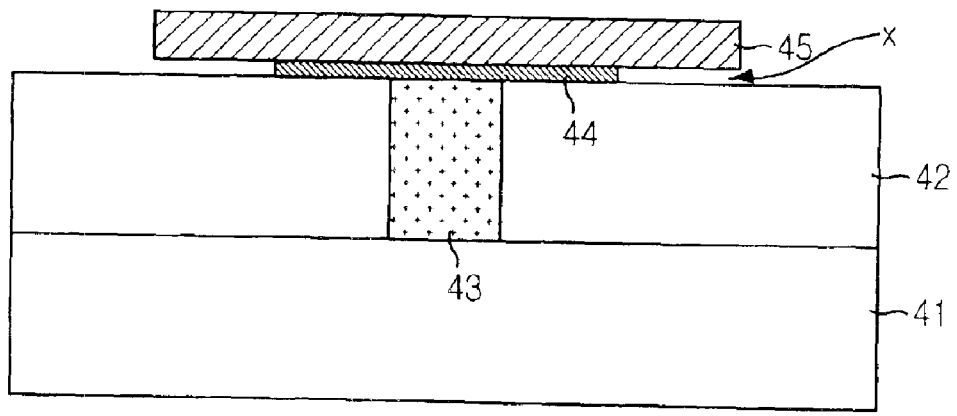

Referring to FIG. 5B, the lower electrode mask 46 is removed, and a wet type etching process is applied to the barrier metal 44 through the use of a solution that etches selectively the barrier metal 44.

At this time, the wet type etching to the barrier metal 44 is set to perform a lateral etch in an inward direction from the end portion of the lower electrode 45. A concentration of the solution and etch time are regulated to control a lateral etch distance. For example, the solution capable of dissolving selectively the barrier metal 44 through the wet type etching can be at least more than one selected from a group consisting of $H_2SO_4$, $HNO_3$ and $H_3PO_4$ or a solution obtained by adding $H_2O_2$ or $NH_4OH$ to the above selected one. Also, when selectively dissolving the barrier metal 44, a concentration of the etch solution for controlling an etch width in horizontal direction is controlled.

After performing the wet type etching process to the barrier metal 44 as described above, a space 'X' is formed between the lower electrode 45 and the first inter-layer insulating layer 42. Meanwhile, a width of the space 'X' can be controlled by controlling a surface thickness of the barrier metal 44 through an etch-back process or a chemical mechanical polishing process after depositing the barrier metal 44.

Figure 5C:
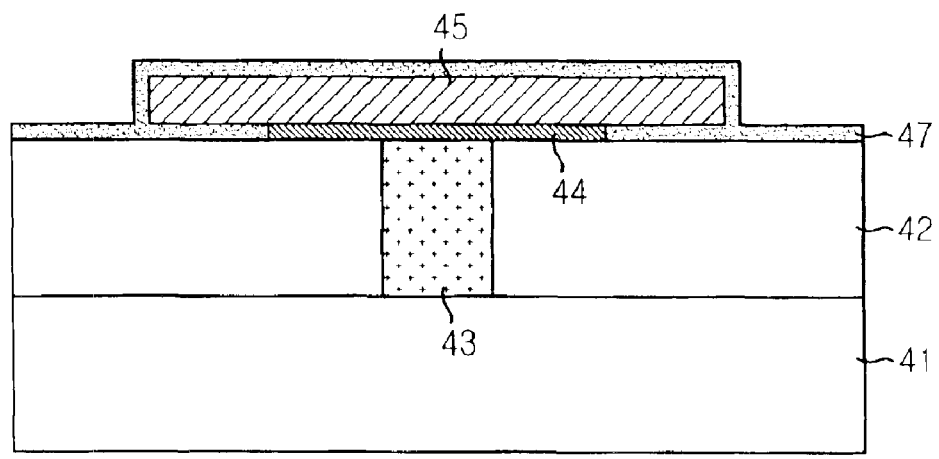

With reference to FIG. 5C, the glue layer 47 is deposited on the above entire structure including the lower electrode 45.

At this time, the glue layer 47 is deposited through the use of a deposition technique with a good step coverage providing a sufficient filling of the space 'X'. For instance, such ALD technique, CVD technique and PEALD technique can be used for the glue layer 47 deposition. The glue layer 47 also uses any one material or more than one material selected from a group consisting of $Al_2O_3$, $ZrO_2$, $HfO_2$, $Bi_2O_3$, $Ta_2O_5$, $TiO_2$ and silicon nitride.

If the glue layer 47 is deposited as explained above, the lower electrode 45 is not directly contacted to the first inter-layer insulating layer 42, and thus, there arises a problem of the height difference due to an opened portion by the glue layer 47.

Figure 5D:
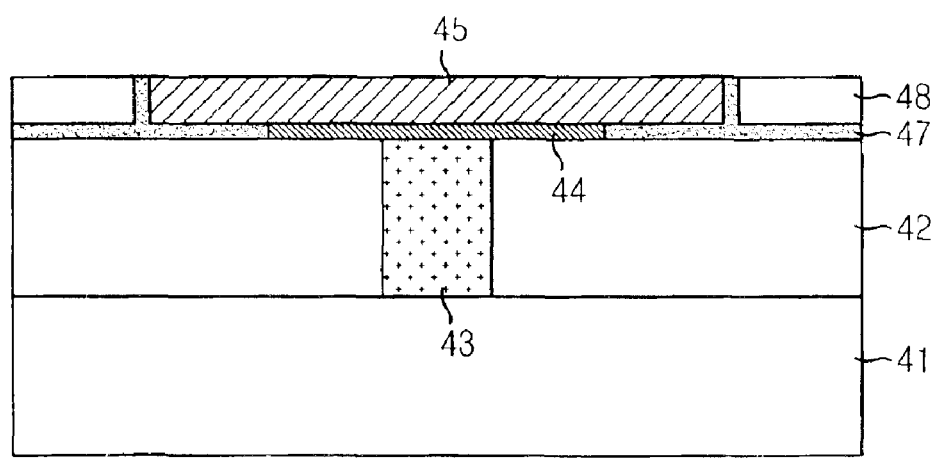

Referring to FIG. 5D, the second inter-layer insulating layer 48 is deposited on the above entire structure including the glue layer 47, and a CMP process or an etch-back process is used until exposing a surface of the lower electrode 45 so to achieve a planarization. That is, the second inter-layer insulating layer 48 and the glue layer 47 are subjected to the CMP process all at once, or the second inter-layer insulating layer 48 is first proceeded with the CMP process, followed by an etch-back process performed to the exposed glue layer 47 from the previous CMP process until exposing the surface of the lower electrode 45.

As described in the above, the glue layer 47 on the lower electrode 45 is removed after the CMP process or the etch-back process, resulting in an exposure of the surface of the lower electrode 45. The glue layer 47 and the second inter-layer insulating layer 48 encompass the lower electrode 45 after the planarization so that the lower electrode 45 formed on each neighboring cell is isolated from each other.

Also, the glue layer 47 functions as an adhesion layer between the lower electrode 45 and the second inter-layer insulating layer 48.

Figure 5E:
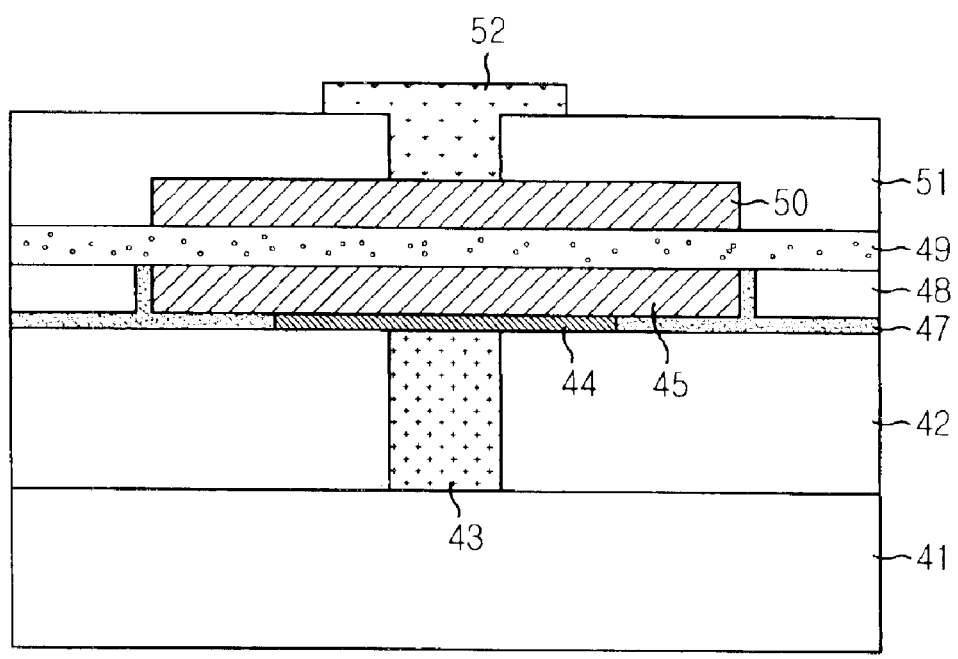

With reference to FIG. 5E, the ferroelectric layer 49 is formed on the above entire structure including the lower electrode 45 of which surface is exposed and patterned so as to be remained only on an entire cell region. Then, a conductive layer for forming the upper electrode 50 is deposited on the ferroelectric layer 49. Herein, the ferroelectric layer 49 is deposited through the use of any one technique selected among a CVD technique, an ALD technique, a MOD technique and a spin coating technique, and uses any one selected from a group consisting of typically used SBT, PZT and BLT or from a group consisting of impurity-added or composition ratio-changed SBT, PZT, SBTN and BLT.

After forming the ferroelectric layer 49, a thermal process for crystallizing the ferroelectric layer 49 with use of the known prior art is proceeded. The ferroelectric layer 49 is formed on the above-described structure including the buried lower electrode 45 and planarized before forming the upper electrode 50 so to achieve easily the planarized structure along with subsequent processes.

The conductive layer for the upper electrode 50 can use a material used for the lower electrode 45.

Next, the above conductive layer are patterned to form the upper electrode 50, and the third inter-layer insulating layer 51 is deposited on the above entire structure including the upper electrode 30 and planarized thereafter. Then, the third inter-layer insulating layer 51 is etched to form a contact hole exposing a partial portion of the upper electrode 50, and a metal line 52 connected to the upper electrode through the contact hole is subsequently formed, whereby the formation of the FeRAM device with the MIP structure is completed.

By following the preferred embodiments of the present invention, it is possible to achieve a simplified process by omitting such additional processes as mask and etch processes for the glue layer and CMP process for the barrier metal. As a result of this simplified process, it is further possible to attain an improvement on productivity and reduced manufacturing costs.

Also, there is provided an effect of improving qualities of manufactured devices due to elimination of the height difference between the lower electrode and the glue layer since a glue layer open process is omitted.

Since a portion providing contacts between the lower electrode and the inter-layer insulating layer is removed, adhesion force is strengthened, further resulting in a decrease in poor bit qualities.

Moreover, an interface diffusion barrier between the lower electrode and the inter-layer insulating layer can be automatically formed by depositing the glue layer after patterning the lower electrode. Therefore, it is possible to prevent oxidation of the barrier metal, thereby improving electric characteristics of a device.

While the present invention has been described with respect to certain preferred embodiments, it will be apparent to those skilled in the art that various changes and modifications may be made without departing from the scope of the invention as defined in the following claims.

What is claimed is:

1. A method for fabricating a ferroelectric memory device, comprising the steps of:

forming a storage node contact making a contact to a semiconductor substrate by passing through the first inter-layer insulating layer formed on the semiconductor substrate;

forming a stack pattern of a barrier layer connected to the storage node contact and a lower electrode;

forming a space between the lower electrode and the first inter-layer insulating layer by removing selectively lateral sides of the barrier layer;

forming simultaneously a glue layer encompassing the lateral sides of the lower electrode as filling the space;

forming a second inter-layer insulating layer exposing a surface of the lower electrode as laterally encompassing the glue layer;

forming a ferroelectric layer on the second inter-layer insulating layer including the lower electrode; and forming an upper electrode on the ferroelectric layer.

2. The method as recited in claim 1, wherein the step of forming the storage node contact includes the steps of:

forming a storage node contact hole exposing a partial portion of the semiconductor substrate by etching the first inter-layer insulating layer;

depositing a plug layer on the first inter-layer insulating layer having the storage node contact hole;

forming the storage node contact plug of which partial portion is filled into the storage node contact hole through a recess etch-back process performed to the plug layer;

depositing a second barrier layer on the first inter-layer insulating layer having the storage node contact plug; and planarizing the second barrier layer through a chemical mechanical polishing process to thereby have the same surface level to that of the first inter-layer insulation layer.

3. The method as recited in claim 2, wherein the step of forming the stack pattern of the barrier layer includes the steps of:

depositing the first barrier layer on the first inter-layer insulating layer having the second barrier layer;

forming a conductive layer for forming the lower electrode on the second barrier layer;

forming a mask defining the lower electrode on the conductive layer; and forming the stack pattern of the first barrier layer and the lower electrode by etching the conductive layer and the second barrier layer with use of the mask as an etch mask.

4. The method as recited in claim 3, wherein the first barrier layer is subjected to an etch-back process or a chemical mechanical polishing process before forming the conductive layer.

5. The method as recited in claim 1, wherein, at the step of forming the space between the lower electrode and the first inter-layer insulating layer, a wet type etching process using a solution capable of selectively dissolving the first barrier layer is performed.

6. The method as recited in claim 5, wherein the etch solution uses at least more than one solution selected from a group consisting of $H_2SO_4$, $HNO_3$ and $H_3PO_4$, or uses a mixed solution obtained by adding $H_2O_2$ or $NH_4OH$ to the above selected solution.

7. The method as recited in claim 1, wherein the step of forming simultaneously the glue layer and the second inter-layer insulating layer includes further the steps of:

forming the glue layer on the lower electrode and the first inter-layer insulation layer until having a thickness to fill the space;

forming the second inter-layer insulating layer on the glue layer; and planarizing the second inter-layer insulating layer and the glue layer until exposing a surface of the lower electrode.

8. The method as recited in claim 7, wherein at the step of planarizing the second inter-layer insulating layer and the glue layer, the second inter-layer insulating layer and the glue layer are subjected to a chemical mechanical polishing process all at once, or the second inter-layer insulating layer is firstly proceeded with a chemical mechanical polishing process followed by an etch-back process performed to the exposed glue layer thereafter.

9. The method as recited in claim 1, wherein the step of forming the storage node contact includes the steps of:

forming a storage node contact hole exposing a partial portion of the semiconductor substrate by etching the first inter-layer insulating layer;

depositing a plug layer on the first inter-layer insulating layer having the storage node contact hole; and forming the storage node contact plug completely filled into the storage node contact hole through a recess etch-back process performed to the plug layer.

10. The method as recited in claim 9, wherein the step of forming the stack pattern of the barrier layer includes the steps of:

depositing the barrier layer on the first inter-layer insulating layer having the storage node contact hole;

forming a conductive layer for forming the lower electrode on the barrier layer;

forming a mask defining the lower electrode on the conductive layer; and forming the stack pattern of the barrier layer and the lower electrode by etching the conductive layer and the barrier layer with use of the mask as an etch mask.

11. The method as recited in claim 1, wherein the glue layer is made of any one material or more than one material selected from a group consisting of $Al_2O_3$, $ZrO_2$, $HfO_2$, $Bi_2O_3$, $Ta_2O_5$, $TiO_2$ and silicon nitride.

* * * * *